(12) United States Patent
Kang et al.

(10) Patent No.: US 7,465,601 B2
(45) Date of Patent: Dec. 16, 2008

(54) METHOD OF FORMING SUSPENDED STRUCTURE

(75) Inventors: Yu-Fu Kang, Taipei (TW); Chen-Hsiung Yang, Taipei Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 0 days.

(21) Appl. No.: 11/736,593

(22) Filed: Apr. 18, 2007

(65) Prior Publication Data

US 2008/0138923 A1    Jun. 12, 2008

(30) Foreign Application Priority Data

Dec. 11, 2006 (TW) .............................. 95146271 A (51) Int. Cl.
*H01L 21/62* (2006.01)
(52) U.S. Cl. .................. 438/52; 438/459; 438/670; 257/E21.043; 257/E21.038
(58) Field of Classification Search ...................... None
See application file for complete search history.

(56) References Cited

U.S. PATENT DOCUMENTS

| | | | | |
|---|---|---|---|---|
| 5,888,845 | A * | 3/1999 | Bashir et al. | 438/53 |
| 7,258,806 | B1 * | 8/2007 | Ho | 216/2 |
| 2004/0140732 | A1 * | 7/2004 | Truninger et al. | 310/300 |
| 2007/0298613 | A1 * | 12/2007 | Kang | 438/689 |

* cited by examiner

*Primary Examiner*—Hsien-ming Lee
*Assistant Examiner*—Shaka Scarlett
(74) *Attorney, Agent, or Firm*—Winston Hsu (57) ABSTRACT

A method of forming a suspended structure is disclosed. Initially, a substrate is provided. A patterned first sacrificial layer and a patterned second sacrificial layer are formed on a front surface of the substrate. The second sacrificial layer has an opening exposing a part of the substrate and a part of the first sacrificial layer. A structural layer is formed covering the abovementioned sacrificial layers. Thereafter, a lift-off process is performed to remove the second sacrificial layer and define the pattern of the structural layer. A first etching process is performed on a back surface of the substrate utilizing the first sacrificial layer as an etching barrier and a through hole is formed under the first sacrificial layer. A second etching layer is performed to remove the first sacrificial layer and a suspended structure is thereby formed.

15 Claims, 9 Drawing Sheets

METHOD OF FORMING SUSPENDED STRUCTURE

BACKGROUND OF THE INVENTION

1. Field of the Invention

The present invention relates to a method of forming a suspended structure, and particularly, to a method utilizing a patterned photoresist as a sacrificial layer and subsequently etching a substrate for suspending a structure layer to form a suspended structure.

2. Description of the Prior Art

In the MEMS field, three major processing technologies are Si micromachining technology, LIGA processing technology, and micromechanical machining technology. Since Si micromachining technology can be incorporated into the IC manufacturing process, it has become the most popular processing technology for MEMS device fabrication.

Figure 1:
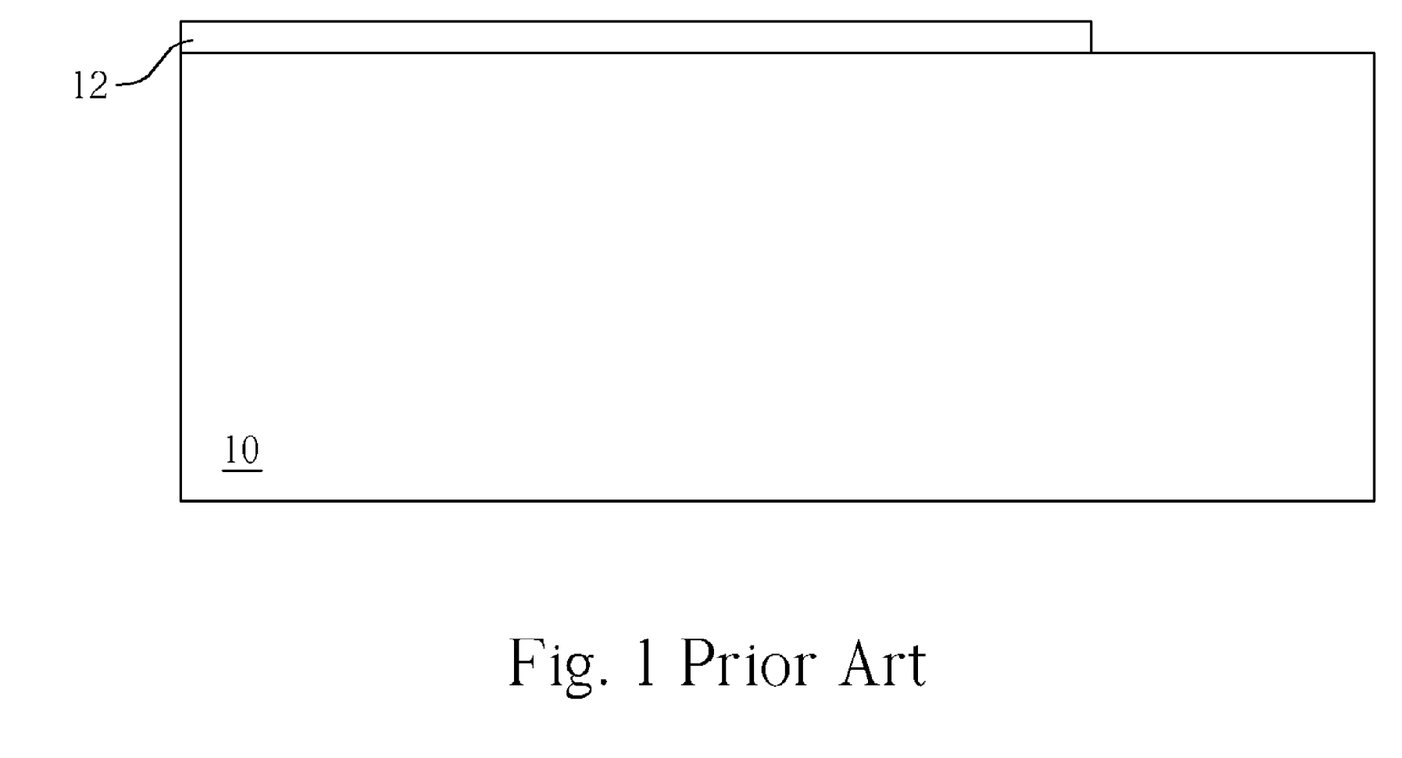
FIGS. 1-3 are schematic diagrams illustrating a conventional method of forming a suspended structure utilizing Si micromachining technology.
Figure 2:
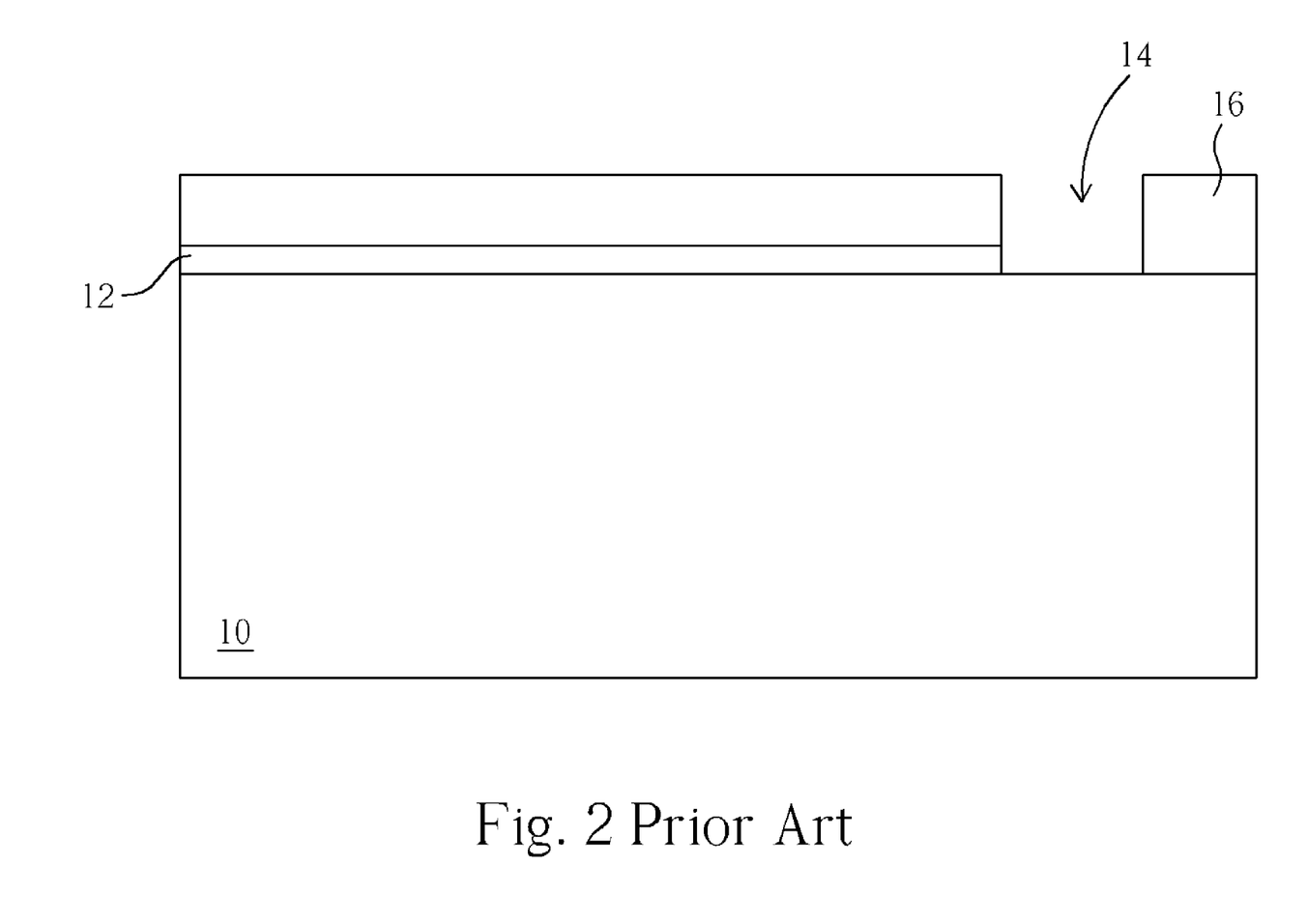
Figure 3:
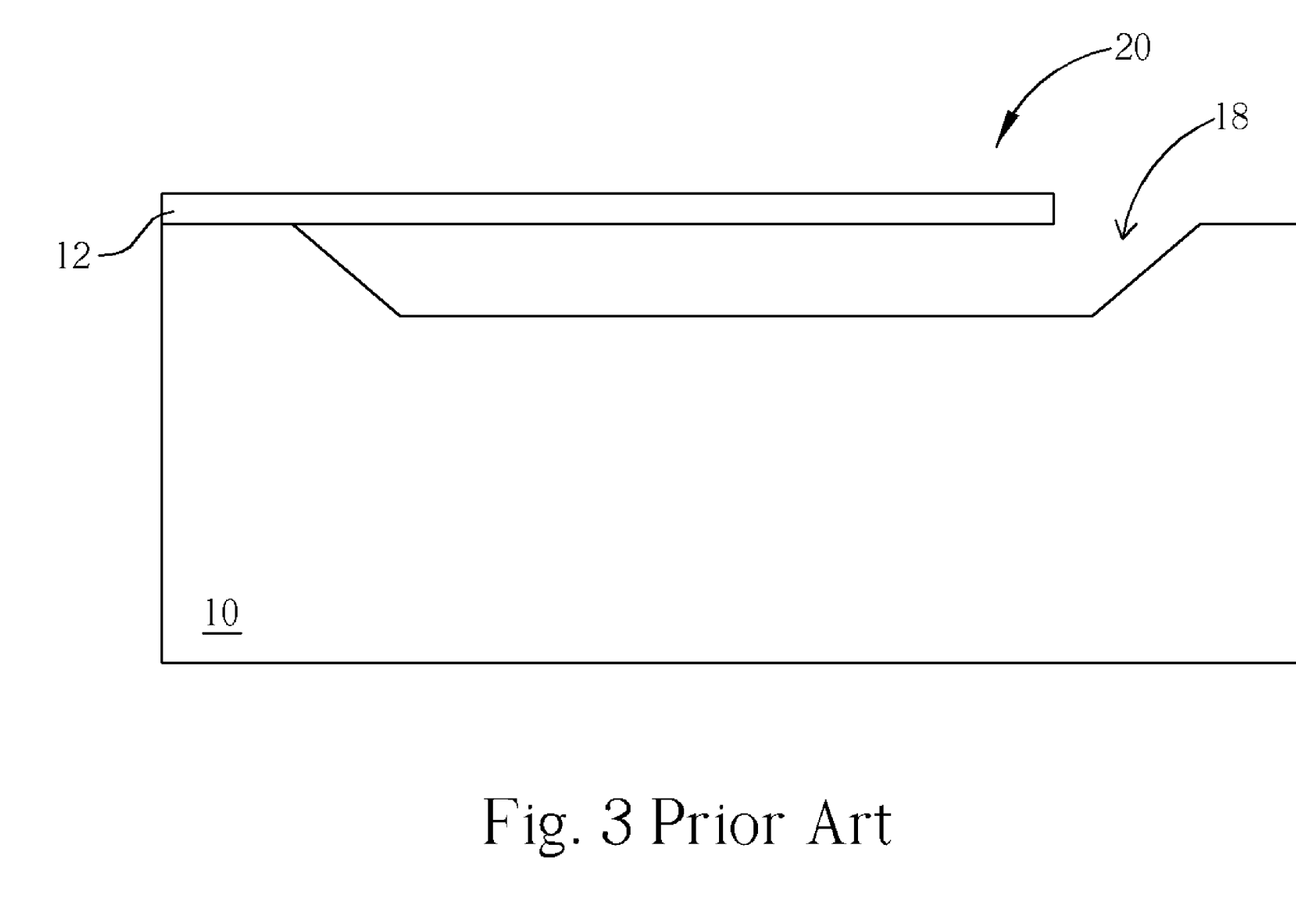

A conventional method of manufacturing a suspended structure utilizing Si micromachining technology is illustrated with reference to FIGS. 1-3. As shown in FIG. 1, a silicon substrate 10 having a patterned structural layer 12 on a surface thereof is provided. Referring to FIG. 2, a photoresist layer is formed on the structural layer 12 and the silicon substrate 10. A lithography process is performed to define a pattern and thereby a first patterned photoresist 16 having an opening 14 is formed. As shown in FIG. 3, a wet etching process is performed with KOH etching solution to etch the silicon substrate 10 through the opening 14 to form a notch 18. Afterwards, the first patterned photoresist 16 is removed and thereby a suspended structure 20 is formed.

However, the conventional method of manufacturing a suspended structure has several disadvantages. Firstly, materials of the structural layer and the etching solution are confined within certain limits. For example, the KOH etching solution may corrode an aluminum structure layer. Using KOH etching solution must therefore be avoided when the structural layer comprises aluminum. In addition, the material of the etching mask will be confined within certain limits depending on the composition of the etching solution. Only a few materials, such as LPCVD $Si_3N4$ or low stress $Si_3N_4$ for example, can serve as an etching mask when the KOH etching liquid is used. Secondly, the conventional method removes a part of the silicon substrate and forms a notch to keep the structural layer in suspension. The suspended structure may collapse due to surface tension of the etching solution. This will result in a broken suspended structure or a part of the suspended structure sticking to the silicon substrate. Finally, most of the conventional suspended structures are flat structures but not 3D structures. It is very difficult for conventional methods to design and manufacture a suspended structure having a bend of a predetermined angle by adjusting the process parameters. Thus, the products of the suspended structure manufactured by conventional methods can only be applied in a limited number of application fields.

SUMMARY OF THE INVENTION

It is therefore a primary objective of the present invention to provide a method of manufacturing a suspended structure. The method of the present invention utilizes a patterned photoresist as a sacrificial layer and etches the substrate from the back surface to form the suspended structure.

According to the present invention, a method of forming a suspended structure is disclosed. Initially, a substrate is provided. A first patterned photoresist is formed on a front surface of the substrate. A thermal process is performed to solidify the first patterned photoresist. A second patterned photoresist is formed on the substrate and the first patterned photoresist. The second patterned photoresist has an opening, which exposes a part of the first patterned photoresist and a part of the substrate. A structural layer is formed to cover the second patterned photoresist and the substrate. A lift-off process is performed to remove the second patterned photoresist and a part of the structural layer. Afterwards, a thinning process is performed on a back surface of the substrate. A first etching process is performed to form a through hole under the first patterned photoresist. Subsequently, a second etching process is performed to remove the first patterned photoresist so that the structural layer is suspended. Thereby, a suspended structure is formed.

The present invention etches a through hole from the back surface of the substrate to suspend the structural layer and thereby forms a suspended structure. The through hole provides a vibrating sphere for the suspended structure in the vertical direction. As a result, the suspended structure of the present invention has a larger amplitude of vibration than a conventional suspended structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 4:
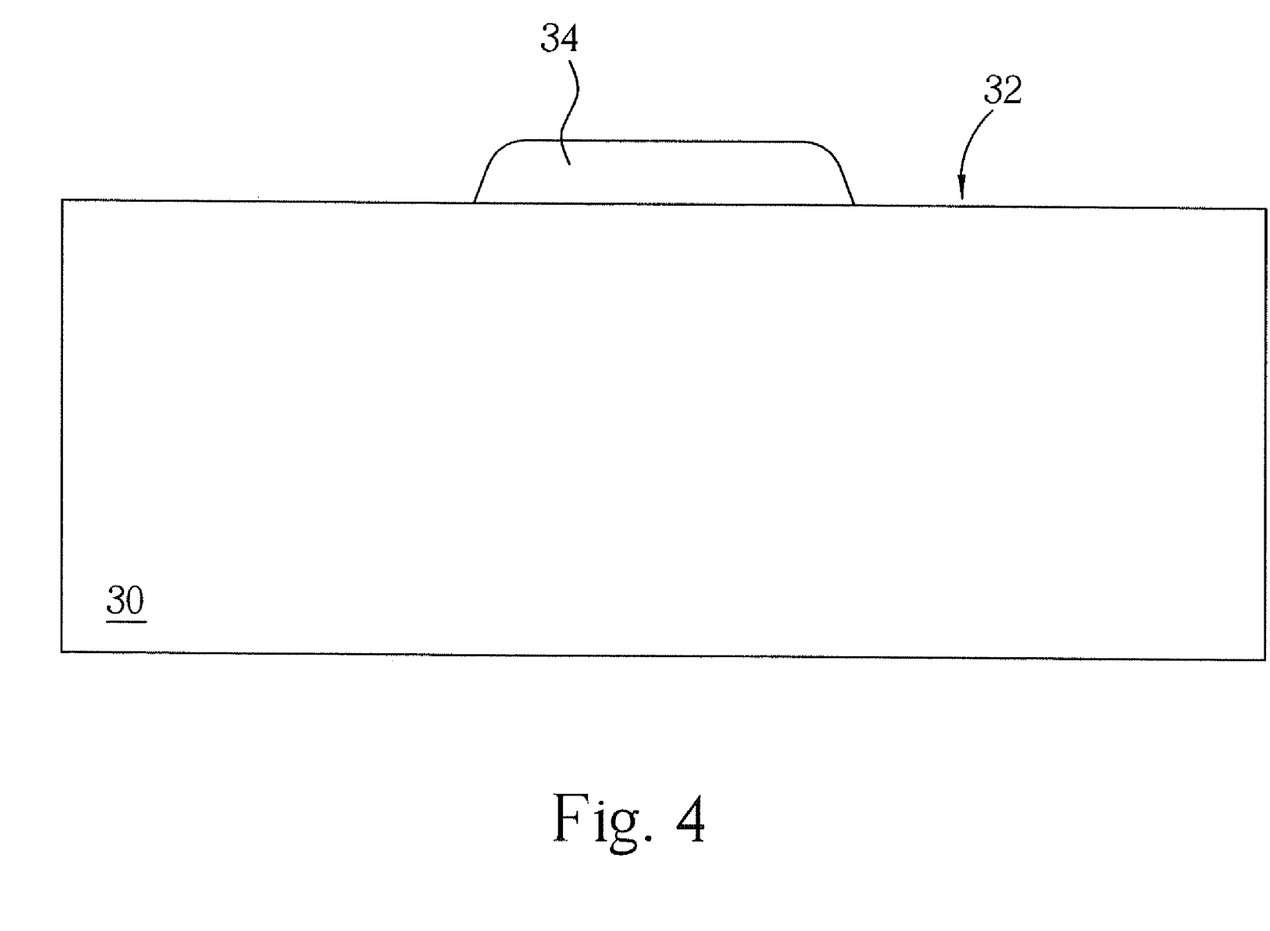
FIGS. 4-9 are schematic diagrams illustrating a method of forming a suspended structure according to a preferred embodiment of the present invention.

Please refer to FIGS. 4-9. FIGS. 4-9 are schematic diagrams illustrating a method of forming a suspended structure according to a preferred embodiment of the present invention. As shown in FIG. 4, a substrate 30 is provided. This embodiment uses a silicon substrate or a SOI substrate for illustration, but other types of substrates are allowable. A photoresist (not shown) is spun on a front surface 32 of the substrate 30, and a lithography process is performed to define a pattern and form a first patterned photoresist 34 on the front surface 32 of the substrate 30. A thermal process is performed with a hot plate, IR radiation, or thermal convention to heat up the first patterned photoresist 34. The thermal process solidifies the first patterned photoresist 34 and molds the first patterned photoresist 34 to form an inclined sidewall. Therefore, the first patterned photoresist 34 has a rounded edge.

Figure 5:
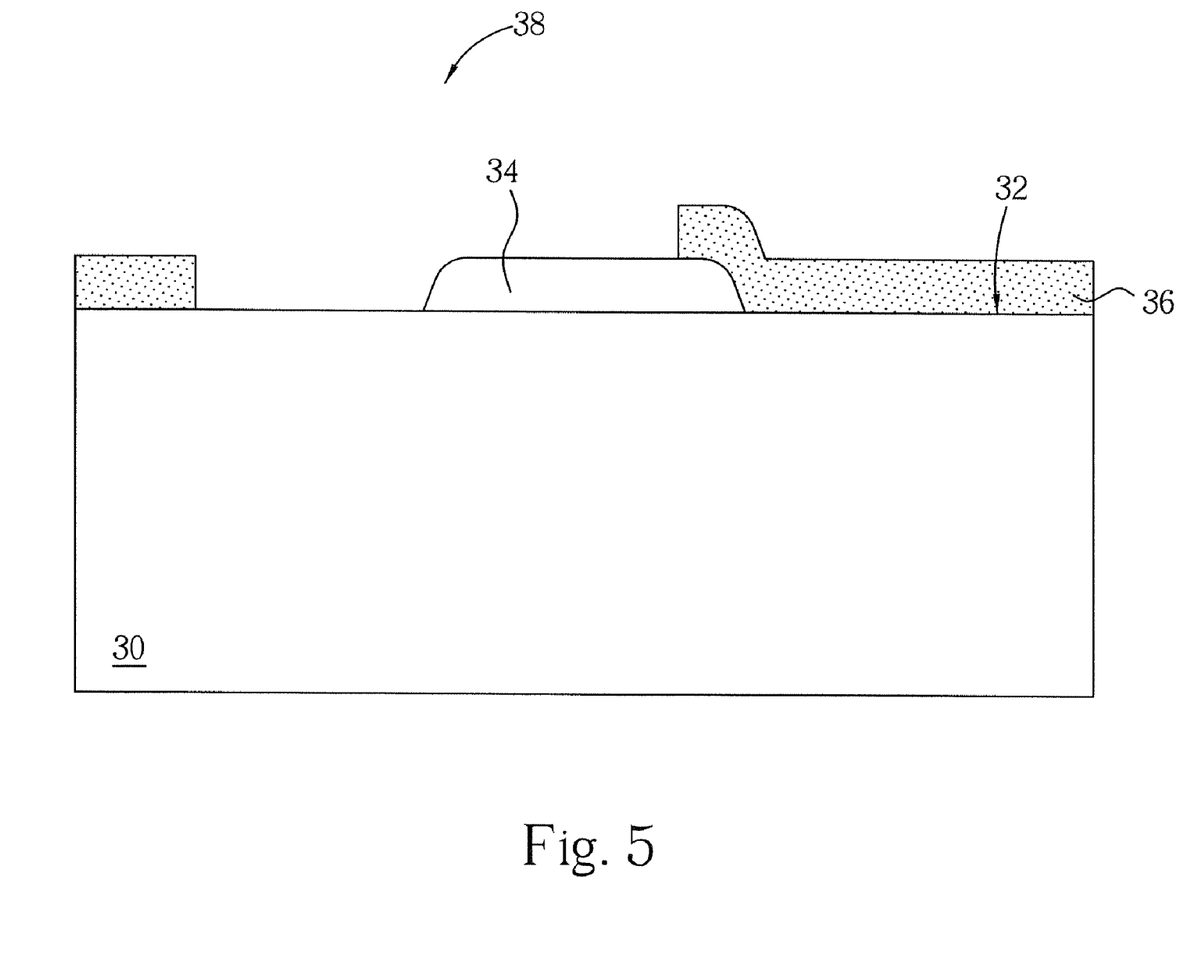

Referring to FIG. 5, another photoresist (not shown) is spun on the substrate 30 and the first patterned photoresist 34. A lithography process is performed to define a pattern and form a second patterned photoresist 36. The second photoresist 36 has an opening 38, which exposes a part of the substrate 30 and a part of the first patterned photoresist 34. In addition, the first patterned photoresist 34 and the second patterned photoresist 36 respectively act as a first sacrificial layer and a second sacrificial layer during the processes. The material of the sacrificial layers may use photoresist or other materials having similar properties as photoresist in the embodiment.

Figure 6:
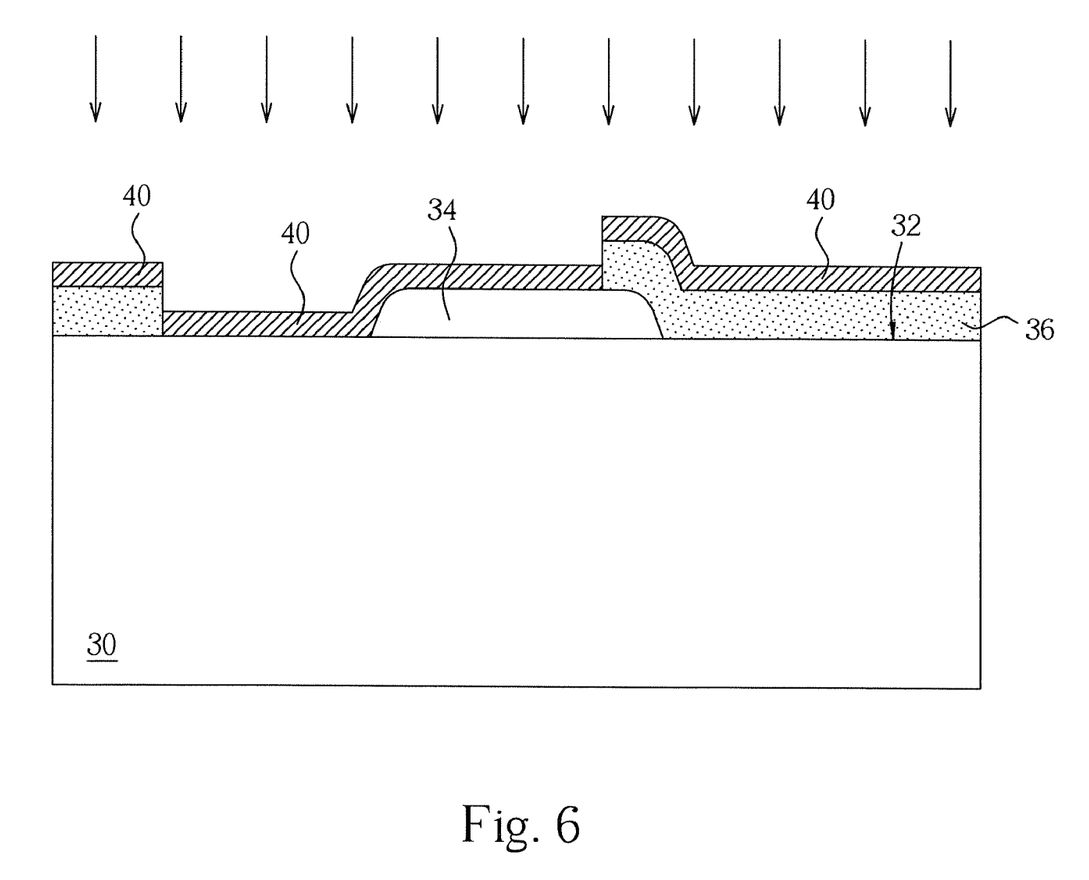

As shown in FIG. 6, a deposition process is performed to form a structural layer 40 covering the substrate 30, the first patterned photoresist 34 and the second patterned photoresist 36. The material of the structural layer 40 may include metal, single crystalline, polysilicon, amorphous silicon, or combinations thereof. Additionally, the structural layer 40 may be formed by other methods, such as a plating process, a chemical vapor deposition (CVD) process, or a physical deposition (PVD) process.

Figure 7:
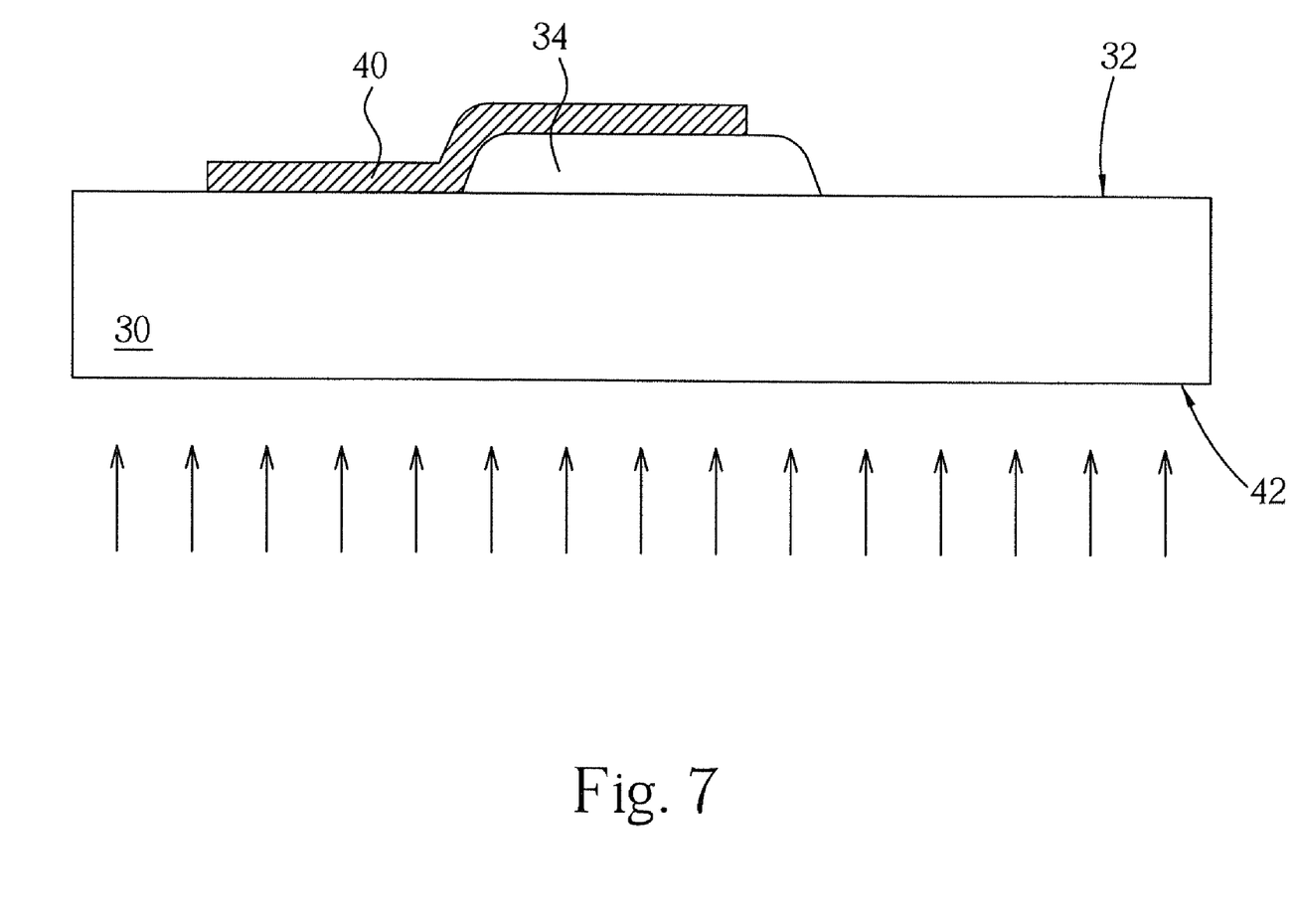

As shown in FIG. 7, a lift-off process is performed by a wet etching process, for example, to remove the second patterned photoresist 38 and a part of the structural layer 40 disposed on the second patterned photoresist 38. After the lift-off process, a thinning process is optionally performed depending on the depth of the substrate 30. The thinning process, such as a CMP process, reduces the thickness of the substrate 30 from a back surface 42 of the substrate 30 until the substrate 30 has a predetermined thickness. The thinning process may increase the working efficiency of the following etching process. Furthermore, the thinning process may be performed in several steps. For example, the first step of the thinning process may be a grinding process, which roughly reduces the thickness of the substrate 30. A polishing process or an etching process is then performed to smooth the back surface 42 of the substrate 30.

Figure 8:
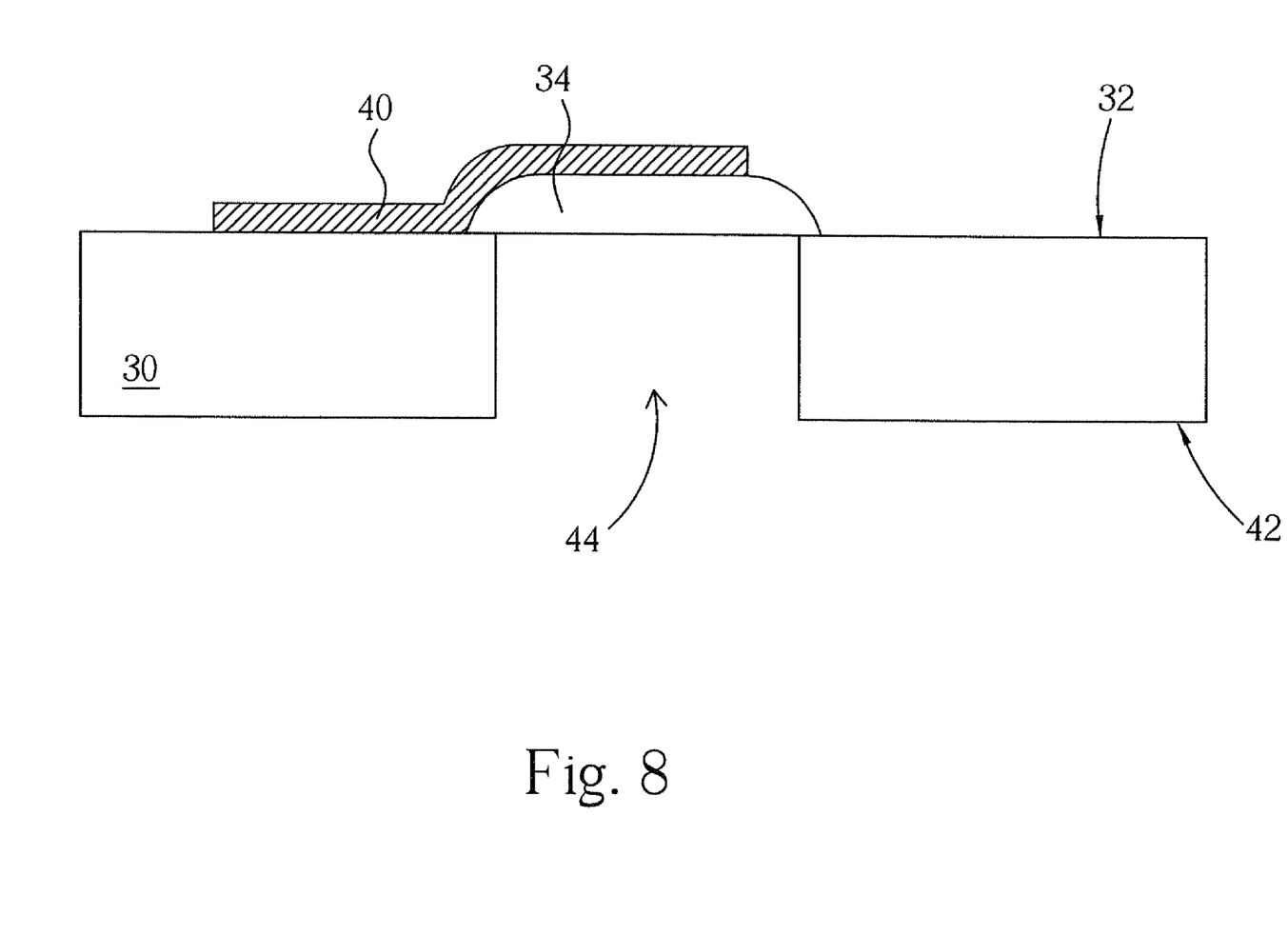
Figure 9:
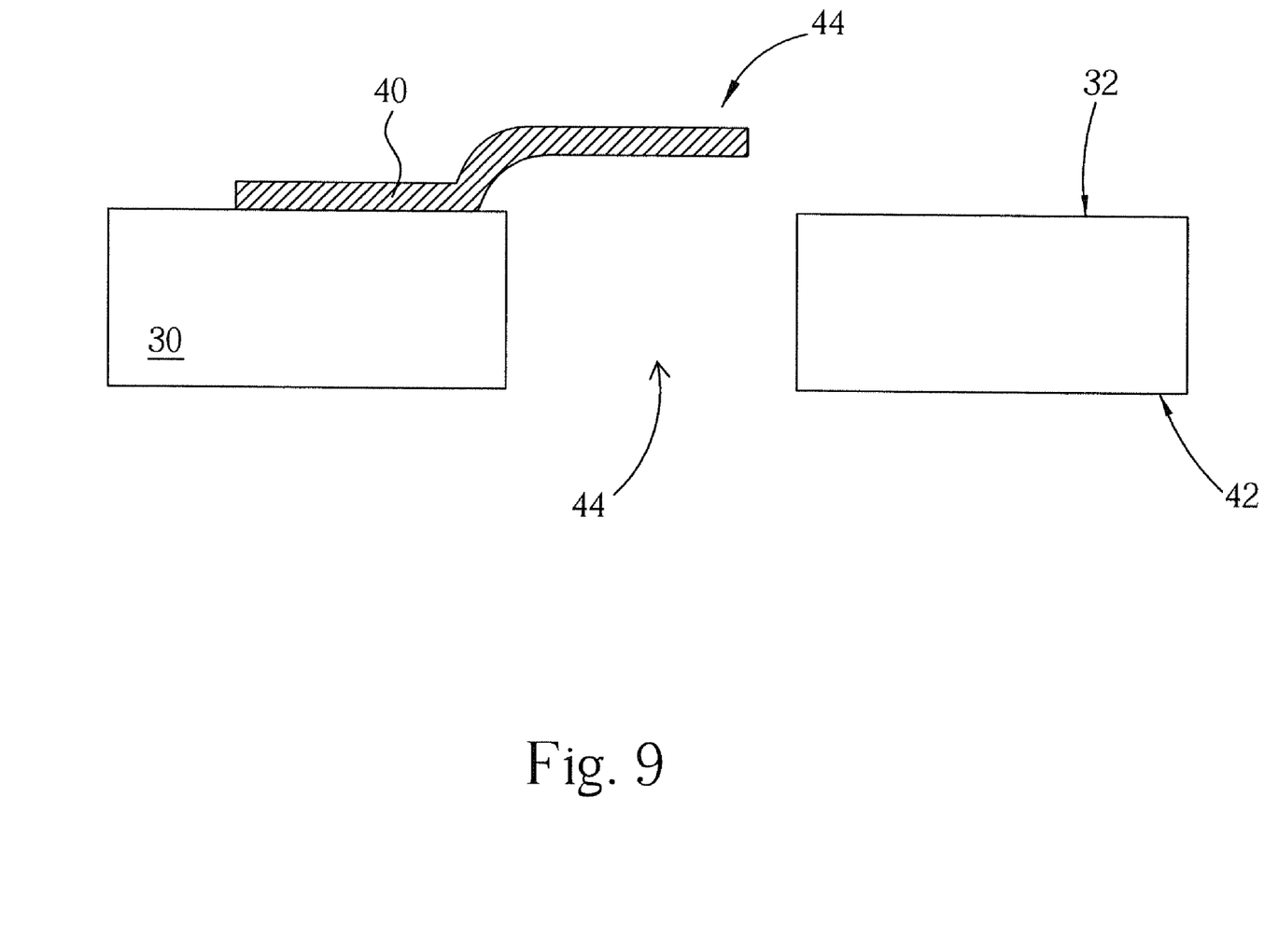

Referring to FIG. 8, an etching process is performed on the back surface 42 of the substrate 30 to form a through hole 44 under the first patterned photoresist 34. The etching process may be a wet etching process or a dry etching process, such as a plasma etching process or a deep reactive ion etching (DRIE) process. It should be noted that the first pattern photoresist 34 positioned under the structural layer 40 acts as an etch stop layer during the etching process. The first patterned photoresist 34 prevents the etchant from corroding the structural layer 40. As shown in FIG. 9, a dry etching process is performed to remove the first patterned photoresist 34. Therefore, the structural layer 40 is suspended and a suspended structure 46 is formed.

According to the aforementioned embodiment, the present invention utilizes the patterned photoresist as a sacrificial layer for many reasons. For example, the patterned photoresist supports the suspended structure during the wet etching process and prevents the suspended structure from sticking to the substrate. Secondly, the patterned photoresist acts as an etch stop layer when forming the through hole from the back surface of the substrate. In addition, the patterned photoresist prevents the suspended structure from damage generating by over etching. The patterned photoresist has an inclined sidewall, and therefore the suspended structure of the present invention has a bend of a predetermined angle. Furthermore, the component of the etching solution does not limit the suspended structure material selection. Any material capable of forming the suspended structure by a deposition process or a plating process is allowable. Finally, the through hole positioned under the suspended structure may connect other devices and form a cavity for suspended structure vibration so that the suspended structure has a greater amplitude of vibration than the conventional suspended structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a suspended structure, comprising the steps of:
    providing a substrate;
    forming a first patterned photoresist on a front surface of the substrate;
    performing a thermal process to solidify the first patterned photoresist;
    forming a second patterned photoresist on the substrate and the first patterned photoresist, the second patterned photoresist having an opening to expose a part of the first patterned photoresist and a part of the substrate;
    forming a structural layer covering the first patterned photoresist, the second patterned photoresist, and the substrate;
    performing a lift-off process to remove the second patterned photoresist and a part of the structural layer;
    performing a thinning process on a back surface of the substrate;
    performing a first etching process on the back surface of the substrate and forming a through hole positioned below the first patterned photoresist; and
    performing a second etching process to remove the first patterned photoresist and form a suspended structure.

2. The method of claim 1, wherein the step of forming the structural layer comprises a chemical physical vapor deposition (CVD) process, a physical vapor deposition (PVD) process, or a plating process.

3. The method of claim 1, wherein the thermal process rounds the edges of the first patterned photoresist.

4. The method of claim 1, wherein the structural layer comprises metal.

5. The method of claim 1, wherein the thinning process comprises a grinding process.

6. The method of claim 1, wherein the lift-off process comprises a wet etching process.

7. The method of claim 1, wherein the first etching process comprises a dry etching process or a wet etching process.

8. The method of claim 1, wherein the second etching process comprises a dry etching process.

9. A method of forming a suspended structure, comprising the steps of:
    providing a substrate;
    forming a first sacrificial layer on a front surface of the substrate;
    forming a second sacrificial layer on the substrate and the first sacrificial layer, the second sacrificial layer having an opening to expose a part of the first sacrificial layer and a part of the substrate;
    forming a structural layer covering the second sacrificial layer, the exposed part of the first sacrificial layer, and the exposed part of the substrate;
    performing a lift-off process to remove the second sacrificial layer and a part of the structural layer;
    performing an etching process utilizing the first sacrificial layer as an etch stop layer to form a through hole below the first sacrificial layer; and
    performing a dry etching process to remove the first sacrificial layer and form a suspended structure.

10. The method of claim 9, wherein the step of forming the structural layer comprises a chemical physical vapor deposition (CVD) process, a physical vapor deposition (PVD) process, or a plating process.

11. The method of claim 9, wherein the structural layer comprises metal.

12. The method of claim 9, wherein the lift-off process comprises a wet etching process.

13. The method of claim 9, wherein the etching process comprises a dry etching process or a wet etching process.

14. The method of claim 9, further comprising: performing a thinning process on a back surface of the wafer before the etching process is performed.

15. The method of claim 14, wherein the thinning process comprises a grinding process.

* * * * *